(12) United States Patent
Thomas

(10) Patent No.: US 7,413,480 B2
(45) Date of Patent: Aug. 19, 2008

(54) SILICON PILLARS FOR VERTICAL TRANSISTORS

(75) Inventor: Patrick Thomas, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 145 days.

(21) Appl. No.: 11/494,420

(22) Filed: Jul. 27, 2006

(65) Prior Publication Data

US 2006/0263973 A1 Nov. 23, 2006

Related U.S. Application Data

(63) Continuation of application No. 10/922,583, filed on Aug. 19, 2004, now Pat. No. 7,247,570.

(51) Int. Cl.
*H01L 21/311* (2006.01)

(52) U.S. Cl. .............................. 439/700; 257/E21.532

(58) Field of Classification Search ........................ None
See application file for complete search history.

(56) References Cited

U.S. PATENT DOCUMENTS

| | | |
|---|---|---|
| 3,941,629 A | 3/1976 | Jaffe |
| 4,139,442 A | 2/1979 | Bondur et al. |
| 4,333,964 A | 6/1982 | Ghezzo |
| 4,472,459 A | 9/1984 | Fisher |
| 4,508,757 A | 4/1985 | Fabricius et al. |
| 4,551,910 A | 11/1985 | Patterson |
| 4,615,762 A | 10/1986 | Jastrzebski et al. |
| 4,630,356 A | 12/1986 | Christie et al. |
| 4,746,630 A | 5/1988 | Hui et al. |
| 4,789,560 A | 12/1988 | Yen |
| 4,903,344 A | 2/1990 | Inoue |
| 4,959,325 A | 9/1990 | Lee et al. |
| 4,965,221 A | 10/1990 | Dennison et al. |
| 5,041,898 A | 8/1991 | Urabe et al. |
| 5,057,449 A | 10/1991 | Lowrey et al. |
| 5,087,586 A | 2/1992 | Chan et al. |
| 5,128,274 A | 7/1992 | Yabu et al. |
| 5,149,669 A | 9/1992 | Hosaka |
| 5,210,046 A | 5/1993 | Crotti |

(Continued)

FOREIGN PATENT DOCUMENTS

JP 53-148389 12/1978

(Continued)

OTHER PUBLICATIONS

"Notes from IEDM, part 3," http://www.thinfilmmfg.com/Noteworthy/Noteworthy01/IEDM12Dec01.htm, 2 pages (Dec. 12, 2001).

(Continued)

*Primary Examiner*—Scott B. Geyer
(74) *Attorney, Agent, or Firm*—Knobbe, Martens, Olson & Bear, LLP

(57) ABSTRACT

In order to form a more stable silicon pillar which can be used for the formation of vertical transistors in DRAM cells, a multi-step masking process is used. In a preferred embodiment, an oxide layer and a nitride layer are used as masks to define trenches, pillars, and active areas in a substrate. Preferably, two substrate etch processes use the masks to form three levels of bulk silicon.

22 Claims, 12 Drawing Sheets

U.S. PATENT DOCUMENTS

| | | | |
|---|---|---|---|
| 5,252,504 | A | 10/1993 | Lowrey et al. |
| 5,260,229 | A | 11/1993 | Hodges et al. |
| 5,316,966 | A | 5/1994 | Van Der Plas et al. |
| 5,334,548 | A | 8/1994 | Shen et al. |
| 5,358,894 | A | 10/1994 | Fazan et al. |
| 5,409,563 | A | 4/1995 | Cathey |
| 5,438,016 | A | 8/1995 | Figura et al. |
| 5,457,067 | A | 10/1995 | Han |
| 5,458,999 | A | 10/1995 | Szabo et al. |
| 5,466,632 | A | 11/1995 | Lur et al. |
| 5,468,675 | A | 11/1995 | Kaigawa |
| 5,607,874 | A | 3/1997 | Wang et al. |
| 5,747,377 | A | 5/1998 | Wu |
| 5,789,306 | A | 8/1998 | Roberts et al. |
| 5,834,359 | A | 11/1998 | Jeng et al. |
| 5,895,273 | A | 4/1999 | Burns et al. |
| 5,899,727 | A | 5/1999 | Hause et al. |
| 5,909,630 | A | 6/1999 | Roberts et al. |
| 6,008,106 | A | 12/1999 | Tu et al. |
| 6,097,065 | A | 8/2000 | Forbes et al. |
| 6,104,068 | A | 8/2000 | Forbes |
| 6,150,687 | A | 11/2000 | Noble et al. |
| 6,306,727 | B1 | 10/2001 | Akram |
| 6,320,222 | B1 | 11/2001 | Forbes et al. |
| 6,350,635 | B1 | 2/2002 | Noble et al. |
| 6,355,961 | B1 | 3/2002 | Forbes |
| 6,376,317 | B1 | 4/2002 | Forbes et al. |
| 6,377,070 | B1 | 4/2002 | Forbes |
| 6,399,979 | B1 | 6/2002 | Noble et al. |
| 6,413,825 | B1 | 7/2002 | Forbes |
| 6,414,356 | B1 | 7/2002 | Forbes et al. |
| 6,424,001 | B1 | 7/2002 | Forbes et al. |
| 6,448,601 | B1 | 9/2002 | Forbes et al. |
| 6,492,233 | B2 | 12/2002 | Forbes et al. |
| 6,496,034 | B2 | 12/2002 | Forbes et al. |
| 6,504,201 | B1 | 1/2003 | Noble et al. |
| 6,531,727 | B2 | 3/2003 | Forbes et al. |
| 6,559,491 | B2 | 5/2003 | Forbes et al. |
| 6,566,682 | B2 | 5/2003 | Forbes |
| 6,639,268 | B2 | 10/2003 | Forbes et al. |
| 6,664,806 | B2 | 12/2003 | Forbes et al. |
| 6,670,642 | B2 | 12/2003 | Takaura et al. |
| 6,734,482 | B1 | 5/2004 | Tran et al. |
| 6,734,484 | B2 | 5/2004 | Wu |
| 6,756,625 | B2 | 6/2004 | Brown |
| 6,797,573 | B2 | 9/2004 | Brown |
| 6,798,009 | B2 | 9/2004 | Forbes et al. |
| 6,801,056 | B2 | 10/2004 | Forbes |
| 6,806,137 | B2 | 10/2004 | Tran et al. |
| 6,808,979 | B1 | 10/2004 | Lin et al. |
| 2003/0227072 | A1 | 12/2003 | Forbes et al. |

FOREIGN PATENT DOCUMENTS

| | | |
|---|---|---|
| JP | 60-167349 | 8/1985 |
| JP | 1-100948 | 4/1989 |
| JP | 2-219253 | 8/1990 |
| JP | 4-130630 | 5/1992 |
| JP | 4-162528 | 6/1992 |

OTHER PUBLICATIONS

Lau et al., "High aspect ratio submicron silicon pillars fabricated by photoassisted electrochemical etching and oxidation," *Applied Physics Letters*, vol. 67(13), pp. 1877-1879 (Sep. 25, 1995).

Lau et al., "High aspect ratio sub-micron pillars for light emission studies and photonic band gap material applications," 1995/6 Research Journal, Microelectronics Group, 3 pages (Jun. 1996).

Lutze et al., "Field oxide thinning in poly buffer LOCOS isolation with jActive area spacings to 0.1 μm," *Journal of Electrochemical Society*, vol. 137, No. 6, pp. 1867-1870 (Jun. 1990).

Seeger et al., "Fabrication of ordered arrays of silicon nanopillars," *J. Phys. D: Appl. Phys.*, vol. 32, pp. L129-L132 (1999).

Wolf et al., "Silicon processing for the VLSI era," vol. 1, Lattice Press, CA, USA, pp. 529-555 (1986).

"Quantum confinement effects in a 3D FinFET transistor," http://www.ise.com/appex/FinFET/FinFET.html, 5 pages (Jan. 15, 2003).

Clarke, Peter, "ISSCC: Vertical transistor structures considered," *EE Times Website*, http://www.eetimes.com, 3 pages (Feb. 9, 2000).

Goebel et al., "Fully depleted surrounding gate transistor (SGT) for 70 nm DRAM and beyond," *IEEE*, 5 pages (2002).

Mandelman et al., "Challenges and future directions for the scaling of dynamic random-acess memory (DRAM)," *IBM J. RES. & DEV.*, vol. 46, No. 2/3, pp. 187-212 (Mar./May 2002).

P. Xuan et al., "60nm planarized ultra-thin body solid phase epitaxy MOSFETs," IEEE Device Research Conf., Denver, CO, pp. 67-68, Jun. 2000.

P. Kalavade et al., "A novel sub-10nm transistor," IEEE Device Research Conf., Denver, CO pp. 71-72, Jun. 2000.

J.P. Denton et al., "Fully depleted dual-gate thin-film SOI p-MOSFET's fabricated in SOI islands with an isolated buried polysilicon backgate," *IEEE Electron Device Lett.*, vol. 17, No. 11, pp. 509-511, Nov. 1996.

Xuejue Huang, et al., "Sub-50 nm P-Channel FinFET," *IEEE Transactions on Electron Devices*, vol. 48, No. 5, May 2001.

J. Kedzierski, et al., "High-performance symmetric-gate and CMOS-compatible Vt asymmetric-gate FinFET devices" *IEDM*, 2001, paper 19.5.

K. Kim, et al., "Nanoscale CMOS Circuit Leakage Power Reduction by Double-Gate Device" International Symposium on Low Power Electronics and Design Newport Beach Marriott Hotel, Newport, California, Aug. 9-11, 2004, http://www.islped.org.

B.S. Doyle, et al., "High performance fully-depleted tri-gate CMOS transistors," *IEEE Electron Device Letters*, vol. 24, No. 4, Apr. 2003, pp. 263-265.

B. Doyle, et al., "Tri-Gate fully-depleted CMOS transistors: fabrication, design and layout," 2003 *Symposium on VLSI Technology*. Digest of Technical Papers, Tokyo; Japan Soc. Applied Phys, 2003, pp. 133-134.

H. Takato, et al. "High performance CMOS surrounding gate transistor (SGT) for ultra high density LSIs" *IEEE Electron Devices Meeting*, Technical Digest, pp. 222-225, 1998.

S. Miyano, et al., "Numerical analysis of a cylindrical thin-pillar transistor (CYNTHIA)," *IEEE Transactions on Electron Devices*, vol. 39, No. 8, Aug. 1992, pp. 1876-1881.

H-S P. Wong et al., "Self-aligned (top and Bottom) Double-Gate MOSFET with a 25nm Thick Silicon Channel," *IEEE Int. Electron Device Meeting*, 1997, pp. 427-430.

Hyun-Jin Cho, et al., "A novel pillar DRAM cell 4 Gbit and beyond," *Digest of Technical Papers Symposium on VLSI Technology*, Jun. 9-11, 1998, pp. 38-39.

W. Sakamoto, et al., "A study of current drivability of SGT," *Record of Electrical and Communication Engineering* Conversazione Tohuku University, vol. 72, No. 2, Feb. 2004, pp. 110-111.

R. Nishi, et al., "Concave Source SGT for suppressing punch-through effect," *Transactions of the Institute of Electronics, Information and Communication Engineers* C, vol. J86-C, No. 2, Feb. 2003, pp. 200-201.

W. Zhang, et al., :A study of load capacitance in SGT, *Record of Electrical and Communication Engineering* Conversazione Tohuku University, vol. 71, No. 1, Oct. 2002, pp. 473-474.

H. Yamashita, et al., "A study of process design in three dimensional SGT device," *Record of Electrical and Communication Engineering* Conversazione Tohuku University, vol. 71, No. 1, Oct. 2002, pp. 467-468.

C.K. Date, et al., "Suppression of the floating-body effect using SiGe layers in vertical surrounding-gate MOSFETs," *IEEE Transactions on Electron Devices*, vol. 48, No. 12, Dec. 2001, pp. 2684-2689.

R. Nishi, et al., "Analysis of the shape of diffusion layer of SGT for suppressing substrate bias effect," *Transactions of the Institute of Electronics, Information and Communication Engineers* C, vol. J84-C, No. 10, Oct. 2001, pp. 1018-1020.

I. De, et al., "Impact of gate workfunction on device performance at the 50 nm technology node," *Solid-State Electronics*, vol. 44, No. 6, Jun. 2000, pp. 1077-1080.

Hyun-Jin Cho, et al., "High performance fully and partially depleted poly-Si surrounding gate transistors," In: 1999 *Symposium on VLSI Technology*. Digest of Technical Papers (IEEE Cat. No. 99CH36325). Tokyo, Japan: Japan Soc. Appl. Phys, 1999, pp. 31-32.

T. Nakamura, "A study of steady-state characteristics of SGT type three-dimensional MOS transistor," *Record of Electrical and Communication Engineering Conversazione Tohoku Univeristy*, vol. 66, No. 1, Jan. 1998, pp. 211-212.

T. Endoh, et al. "Analysis of high speed operation for multi-SGT," *Transactions of the Institute of Electronics, Information and Communication Engineers* C-l, vol. J80C-l, No. 8, Aug. 1997, pp. 382-383.

T. Endoh, et al. "An accurate model of fully-depleted surrounding gate transistor (FD-SGT)," *IEICE Transactions on Electronics*, vol. E80-C, No. 7, Jul. 1997, pp. 905-910.

T. Endoh, et al., An analytic steady-state current-voltage characteristic of short channel fully-depleted surrounding gate transistor (FD-SGT), *IEICE Transactions on Electronics*, vol. E80-C, No. 7, Jul. 1997, pp. 911-917.

K. Abhinav, et al, "An analytical temperature dependent threshold voltage model for thin film surrounded gate SOL MOSFET," *Proceedings of the SPIE—The International Society for Optical Engineering*, vol. 3975, pt. 1-2, 2000, pp. 605-608.

S. Miyamoto, et al., "Effect of LDD structure and channel poly-Si thinning on a gate-all-around TFT (GAT) for SRAM's," *IEEE Transactions on Electron Devices*, vol. 46, No. 8, Aug. 1999, pp. 1693-1698.

C. Hyun-Jin, et al., "High performance fully and partially depleted poly-Si surrounding gate transistors," *VLSI Technology*, 1999, Digest of Technical Papers, 1999 Sympsosium on, 14-16, Jun. 1999, pp. 31 32.

M. Terauchi, et al., "Depletion isolation effect of surrounding gate transistors," *IEEE Transactions on*, vol. 44, Issue 12, Dec. 1997, pp. 2203-2305.

A. Kranti, et al., "Optimisation for improved short-channel performance of surrounding/cylindrical gate MOSFETs," *Electronics Letter*, vol. 37, Issue 8, Apr. 12, 2001, pp. 533-534.

F. Matsuoka, et al., "A study of soft error in SGT DRAM," *Record of Electrical and Communication Engineering* Conversazione Tohoku Univeristy, vol. 71, No. 1, Oct. 2002, pp. 469-470, Journal Paper.

M. Suzuki, et al., "The 2.4F/sup 2/ memory cell technology with Stacked-Surrounding Gate Transistor (S-SGT) DRAM," *Transactions of the Institute of Electronics*, Information and Communication Engineers C, vol. J83-C, No. 1, Jan. 2000, pp. 92-93.

T. Endoh, et al., "The analysis of the stacked-surrounding gate transistor (S-SGT) DRAM for the high speed and low voltage operation," *IEICE Transactions on Electronics*, vol. E81-C, No. 9, Sep. 1998, pp. 1491-1498.

T. Endoh, et al., "The Stacked-SGT DRAM using 3D-building memory array technology," *Transactions of the Institute of Electronics, Information and Communication Engineers* C-1, vol. J81C-1, No. 5, May 1998, pp. 288-289.

S.J. Ahn, et al., "Examination and improvement of reading disturb characteristics of a surrounded gate STTM memory cell," In: *2003 Third IEEE Conference on Nanotechnology*. IEEE NANO 2003. Proceedings (Cat. No. 03TH8700). Piscataway, NJ, USA: IEEE, 2003, pp. 528-530, Vol. 2.

S.J. Ahn, et al., "Highly scalable and CMOS-compatible STTM cell technology," In: *IEEE International Electron Devices Meeting 2003*, Piscataway, NJ, USA: IEEE, 2003, pp. 10.4.1-10.4.4.

F. Matsuoka, et al., "Numerical analysis of alpha-particle-induced soft errors in floating channel type surrounding gate transistor (FC-SGT) DRAM cell," *Electron Devices*, IEEE Transactions on, vol. 50, Issue 7, Jul. 2003, pp. 1638-1644.

S. Watanabe, et al., "A novel circuit technology with surrounding gate transistors (SGT's) for ultra high density DRAM's," *Solid State Circuit, Journal of IEEE*, vol. 30, Issue 9, Sep. 1995, pp. 960-971.

T. Endoh, et al., "The 1.44F2 memory cell technology with the stacked-surrounding gate transistor (S-SGT) DRAM," *Microelectronics, 2000. Proceedings. 2000 22$^{nd}$ International Conference on*, vol. 2, May 14-17, 2000, pp. 451-454, vol. 2.

B. Goebel, et al., "Fully depleted surrounding gate transistor (SGT) for 70nm DRAM and beyond," Electron Devices Meeting, 2002, *IEDM '02 Digest*. International, Dec. 8-11, 2002, pp. 275-278.

K. Sunouchi, et al., "A surrounding gate transistor (SGT) cell for 64/256 mbit DRAMs," Electron Devices Meeting, 1989. *Technical Digest.*, International, Dec. 3-6, 1989, pp. 23-26.

M. Terauchi, et al., "A Surrounding Gate Transistor (SGT) Gain Cell For Ultra High Density Drams," VLSI Technology, 1993. *Digest of Technical Papers.* 1993 Symposium on, May 17-19, 1993 pp. 21-22.

M. Iwai, et al., "Buried gate type SGT flash memory," *Transactions of the Institute of Electronics, Information and Communication Engineers* C, vol. J86-C, No. 5, May 2003, pp. 562-564. Journal Paper.

T. Endoh, et al., "Novel ultrahigh-density flash memory with a stacked-surrounding gate transistor (S-SGT) structured cell," *IEEE Transactions on Electron Devices*, vol. 50, No. 4, Apr. 2003, pp. 945-951.

T. Endoh, et al., "Novel ultra high density flash memory with a stacked-surrounding gate transistor (S-SGT) structured cell," In: International Electron Devices Meeting. *Technical Digest*, IEEE, 2001, pp. 2.3.1-2.3.4.

M. Hioki, et al., "An analysis of program and erase operation for FC-SGT flash memory cells," In: *2000 International Conference on Simulation Semiconductor Processes and Devices* (Cat. No. 00TH8502). Piscataway, NJ, USA: IEEE, 2000, pp. 116-118.

T. Endoh, et al., "Floating channel type SGT flash memory," *Transactions of the Institute of Electronics, Information and Communiaction Engineers* C-l, vol. J82C-I, No. 3, Mar. 1999, pp. 134-135.

M. Hioki, et al., "An analysis of program and erase operation for FC-SGT flash memory cells," Simulation of Semiconductor Processes and Devices, 2000. SISPAD 2000. 2000 International Conference on, Sep. 6-8, 2000. pp. 116-118.

T. Sakai, et al., "A study of stacked-SGT-based pass-transistor logic circuit," *Record of Electrical and Communication Engineering* Conversazione Tohoku University, vol. 72, No. 2, Feb. 2004, pp. 108-109.

S. Watanabe, "Impact of three-dimensional transistor on the pattern area reduction for ULSI," *IEEE Transaction on Electron Devices*, vol. 50, No. 10. Oct. 2003, pp. 2073-2080.

T. Endoh, et al., "A high signal swing pass-transistor logic using surrounding gate transistor," In: *2000 International Conference on Simulation Semiconductor Processes and Devices* Cat. No. 00TH8502). Piscataway, NJ, USA: IEEE, 2000. pp. 273-275.

A. Nitayama, et al., "High speed and compact CMOS circuits with multi-pillar surrounding gate transistors," *IEEE Transactions on Electron Devices*, vol. 36, No. 11, pt. 1, Nov. 1989, pp. 2605-2606.

A. Nitayama, "Multi-pillar surrounding gate transistor (M-SGT) for compact and high speed circuits," Electron Devices, *IEEE Transactions* on , vol. 38, Issue 3, Mar. 1991, pp. 579-583.

H. Takato, et al., " Impact of surrounding gate transistor (SGT) for ultra-high density LSI's," Electron Devices, *IEEE Transactions* on, vol. 38, Issue 3, Mar. 1991, pp. 573-578.

B. Doyle, et al., "Tri-Gate fully-depleted CMOS transistors: fabrication, design and layout," 2003 *Symposium on VLSI Technology*. Digest of Technical Papers, Tokyo; Japan Soc. Applied Phys, 2003, pp. 133-134.

A. Kranti, et al., "Optimisation for improved short-channel performance of surrounding/cylindrical gate MOSFETs," *Electronics Letter*, vol. 37, Issue 8, Apr. 12, 2001, pp. 533-534.

SILICON PILLARS FOR VERTICAL TRANSISTORS

This application is a continuation of U.S. application Ser. No. 10/922,583, titled "Silicon Pillars For Vertical Transistors", filed on Aug. 19, 2004, now U.S. Pat. No. 7,247,570 the entirety of which is hereby incorporated herein by reference.

BACKGROUND OF THE INVENTION

1. Field of the Invention

The present invention relates generally to the field of semiconductor fabrication and more specifically to the field of fabricating silicon pillars.

2. Background of the Invention

Since the introduction of the digital computer, electronic storage devices have been a vital resource for the retention of data. Conventional semiconductor electronic storage devices, such as Dynamic Random Access Memory (DRAM), typically incorporate capacitor and transistor structures in which the capacitors temporarily store data based on the charged state of the capacitor structure. In general, this type of semiconductor Random Access Memory (RAM) often requires densely packed capacitor structures that are easily accessible for electrical interconnection.

DRAM circuit manufacturers increasingly face difficulties with scaling. One way of forming smaller transistors is the formation of vertical transistors. Vertical transistors have the advantage of taking up less substrate real estate. The vertical transistor can reduce threshold voltage variations due to electrical and geometric sensitivities to an acceptable level because the channel of the transistor can remain sufficiently long despite occupying less real estate on the substrate. The long channel of vertical transistors allows a thicker gate dielectric that can be properly scaled in proportion to the channel length. This can also provide reliability and protection against wearout.

While the vertical transistor has benefits that can reduce the size of DRAM cells, integration can be challenging. A silicon pillar forms part of the vertical transistor, but the pillars can often be complicated to form. Epitaxially grown pillars can be slow and costly to fabricate, and still have reliability issues. For this reason, a new method of forming silicon pillars for vertical transistors is desirable.

SUMMARY OF THE INVENTION

In one aspect of the invention, a method of forming pillars in a substrate for integrate circuits is disclosed. The method comprises forming a lower hard mask on a substrate and depositing an upper hard mask over the lower hard mask. A first resist mask is formed over the upper hard mask to form first exposed portions of the upper hard mask and the lower hard mask. The first exposed portions of the upper hard mask and the lower hard mask are removed. A second resist mask is formed over the upper hard mask to form second exposed portions of the upper hard mask after removing the first resist mask. The second exposed portions of the upper hard mask are removed to form third exposed portions of the lower hard mask. The substrate is etched selectively against the upper hard mask and the lower hard mask after removing the second exposed portions of the upper hard mask. The third exposed portions of the lower hard mask are removed after etching the substrate. The substrate is etched using the upper hard mask to form a plurality of active areas and trenches after removing the third exposed portions of the lower hard mask.

In another aspect of the invention, a method of forming silicon pillars for vertical transistors for integrated circuits is disclosed. The method comprises forming a first mask layer over a silicon substrate and forming a second mask layer over the first mask layer. The first mask layer is patterned to expose a first portion of the silicon substrate. The second mask layer is patterned to form an unmasked portion of the first mask layer after patterning the first mask layer. The method further comprises etching the first exposed portion of the silicon substrate to a first depth and removing the unmasked portion of the first mask layer to expose a second portion of the silicon substrate. Finally, the first exposed portion of the substrate is etched to a second depth and the second exposed portion is etched to a third depth.

In another aspect of the invention, a masking structure for forming pillars in a substrate is disclosed. The structure comprises a substrate and a first hard mask over the substrate. The first hard mask comprises a plurality of parallel lines. The structure further comprises a second hard mask directly over the first hard mask, wherein the second hard mask is a plurality of islands on the lines of the first hard mask.

A method of forming a silicon pillar is disclosed in another aspect of the invention. The method comprises forming an oxide layer over a silicon substrate and depositing a nitride layer over the oxide layer. A first portion of the nitride layer and the oxide layer are removed to expose a plurality of trench regions in the silicon substrate and to form an oxide hard mask. A second portion of the nitride layer is removed to form a nitride hard mask and to form unmasked portions of the oxide hard mask after removing the first portion of the oxide layer and the nitride layer. The trench regions are etched after removing the second portion of the nitride layer. The unmasked portions of the oxide hard mask are removed to expose a plurality of intermediate substrate regions. The method further comprises etching the intermediate substrate regions and the trench regions after removing the unmasked portions of the oxide hard mask.

A method of forming a pillar in a substrate is disclosed in another aspect of the invention. The method comprises exposing a trench region of a substrate and etching the trench region to a first depth. An intermediate region of the substrate is exposed after etching the trench region and the intermediate region is etched to a second depth and the trench region is etched to a third depth. The third depth is equal to a sum of the first depth and the second depth.

BRIEF DESCRIPTION OF THE DRAWINGS

These and other aspects of the invention will be better understood from the Detailed Description of the Preferred Embodiments and from the appended drawings, which are meant to illustrate and not to limit the invention, and wherein.

DETAILED DESCRIPTION OF THE PREFERRED EMBODIMENT

In order to more efficiently form a silicon pillar which can be used for the formation of vertical transistors in DRAM cells, a multi-step masking process is used. In a preferred embodiment, an oxide layer and a nitride layer are used as masks to define trenches, pillars, and intermediate areas in a silicon substrate. The skilled artisan will readily appreciate, however, that the principles and advantages of the processes described herein will have application with a variety of materials. Preferably, selective etch chemistries are available for etching each of the two mask materials and the substrate relative to the other two materials.

Figure 1A:
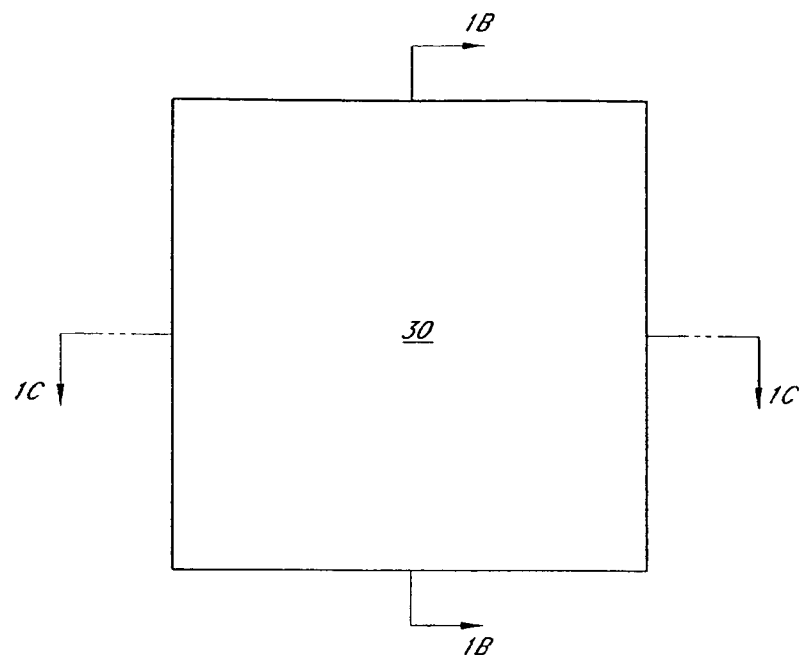
FIG. 1A shows a plan view of a structure with two mask layers over a substrate according to an embodiment of the present invention.
Figure 1B:
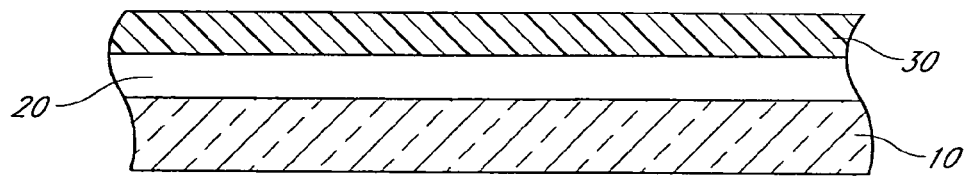
FIG. 1B shows a schematic first cross-sectional view of the structure of FIG. 1A, taken along lines 1B-1B.
Figure 1C:
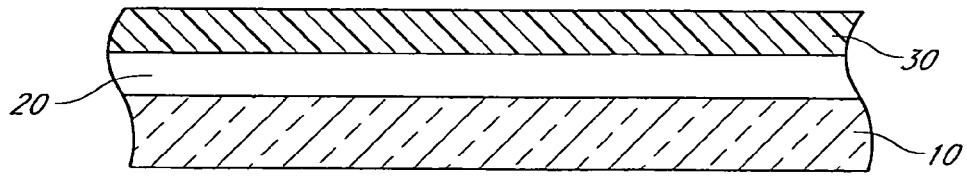
FIG. 1C shows a schematic second cross-sectional view of the structure of FIG. 1A, taken along lines 1C-1C.
Figure 1D:
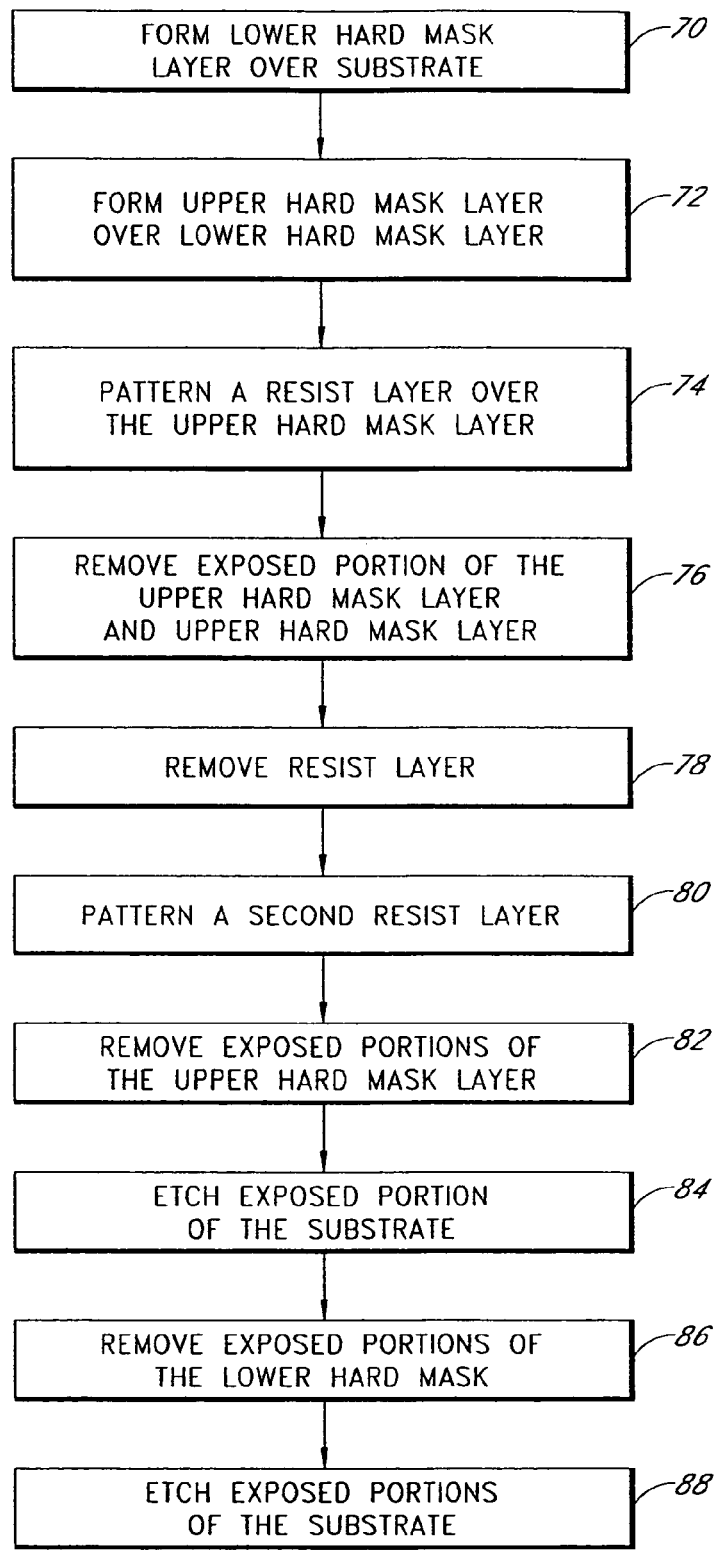
FIG. 1D is a flow chart of an embodiment of the invention.

Referring now to FIG. 1D, a flow chart of a preferred embodiment, a first or lower hard mask layer is formed 70 over bulk silicon. A second or upper hard mask layer is then formed 72 over the lower hard mask layer. A resist layer is deposited and patterned 74 over the upper hard mask layer to form a first resist mask. The exposed portions of the lower and upper hard mask layers are removed 76 and the resist layer is removed 78. The removal of the exposed portions of the lower hard mask layer and the upper hard mask layer exposes corresponding portions of the substrate that will form the trench regions. Preferably, the trench substrate regions, the lower hard mask, and the upper hard mask are arranged in parallel lines.

A second resist layer is deposited and patterned 80 to form a second resist mask. In a preferred embodiment, the second resist mask is formed substantially perpendicular to the trench substrate regions and the portions of the remaining lower and upper hard masks. The exposed portions of the upper hard mask are removed 82, and the second resist mask can be removed. The trench substrate regions, which were exposed in the pattern of the first resist mask, are then etched 84. As will be better understood from the detailed description below, this step can be considered a partial trench etch, due to a later extension etch. The exposed portions of the lower hard mask are then removed 86 to expose portions of the substrate that will form the intermediate area regions. The intermediate regions have a height that is taller than the trenches but shorter than the pillars. Preferably, the intermediate regions are used as active areas, bit lines, or for other IC design requirements.

The partially etched trench remains exposed. The substrate is then etched 88 a second time. The second etch process will etch both the trench substrate regions, which were previously etched, and the intermediate area substrate regions. The trenches are etched to their final depth, and the intermediate area substrate regions are etched to a depth approximately half of the final trench depth. Pillars are thereby formed from the substrate material. The two hard masks will remain over the pillars. The hard masks can be removed or can remain to serve as protective layer for the pillars during subsequent processing.

In a preferred embodiment, the substrate is a semiconductor, more preferably bulk silicon. Preferably, the lower hard mask is an oxide, more preferably silicon oxide. The upper hard mask is preferably a nitride, more preferably silicon nitride. When the upper hard mask is silicon nitride, the upper hard mask preferably serves as a cap for subsequent processing.

Formation of Two Masking Layers

FIG. 1A is a top down view at a representative portion of the substrate and shows a surface with a uniform material. FIGS. 1B and 1C show cross-sections of the substrate 10 with a layer of lower hard mask material 20 and a layer of upper hard mask material 30. In a preferred embodiment, the substrate 10 is bulk silicon. Preferably, the lower hard mask layer 20 is an oxide layer deposited directly over the substrate 10. In a preferred embodiment, the oxide is a substantially undoped oxide deposited by chemical vapor deposition (CVD), spin-on deposition, or other deposition methods. The oxide can also be thermally grown over the surface of the substrate. In a preferred embodiment, the lower hard mask material 20 has a thickness of between about 30 nm and 100 nm, more preferably between about 50 nm and 80 nm.

In a preferred embodiment, the upper hard mask material 30 is a nitride layer deposited directly over the lower hard mask material 20; more preferably, the upper hard mask material 30 is a silicon nitride layer. The upper hard mask layer 30 is preferably deposited by CVD or a similar deposition process. In addition to its use as a hard mask, the upper hard mask material 30 can be used to protect the silicon pillar being formed from subsequent processing steps. In a preferred embodiment, the upper hard mask layer 30 has a thickness of between about 50 nm and 150 nm, more preferably between about 80 nm and 120 nm.

Figure 2A:
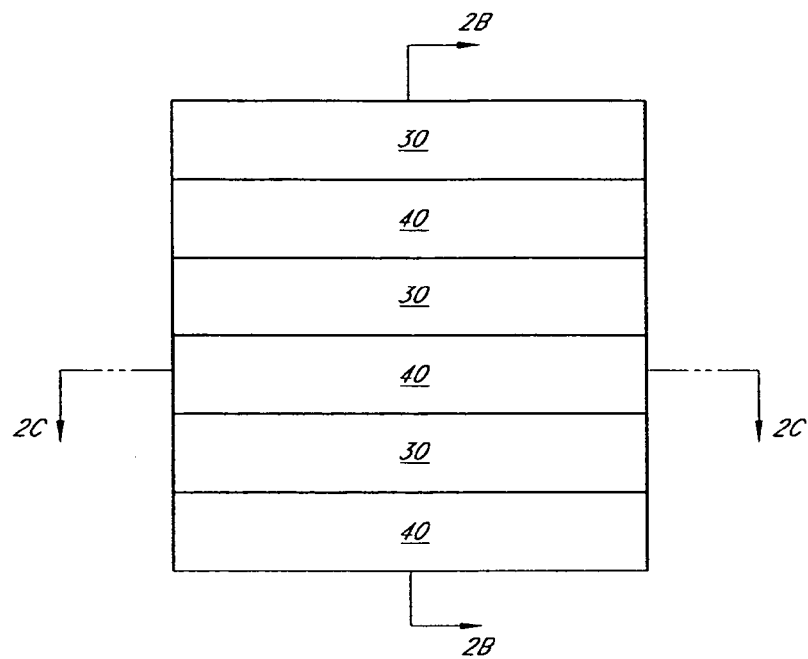
FIGS. 2A-2C show three views of the structure of FIGS. 1A-1C with a first patterned photoresist layer over the two hard mask layers according to an embodiment of the present invention.
Figure 2B:
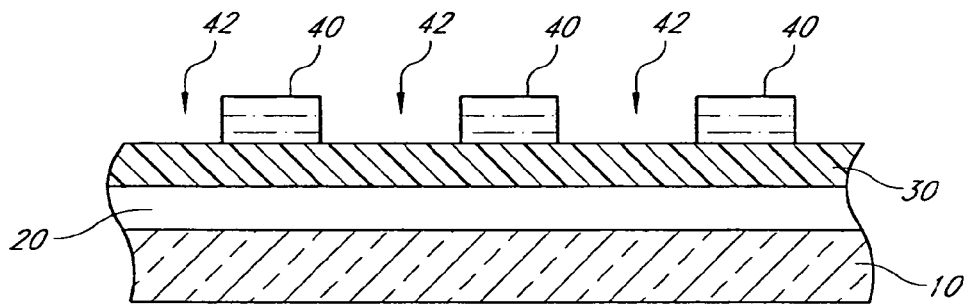
Figure 2C:
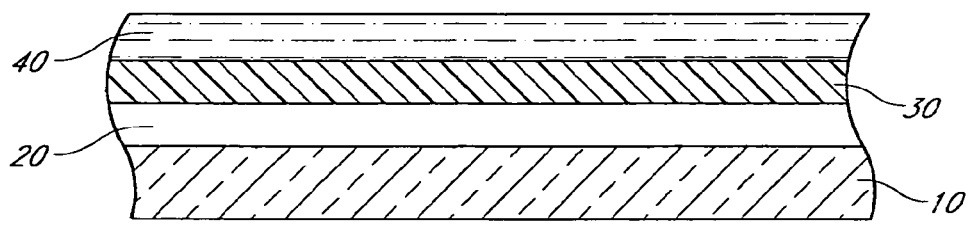

After the deposition of the two hard mask layers, a first resist mask 40 is formed over the upper hard mask layer 30. The first resist mask 40 is seen in FIGS. 2A-2B. In the illustrated embodiment, a photoresist layer 40 is deposited over the upper hard mask 30, although the skilled artisan will readily appreciate that the mask pattern can be transferred to intervening hard mask materials. The photoresist 40 can then be selectively exposed and developed to form a first resist mask 40 using, e.g., standard photoresist developing techniques. The first resist mask 40 can vary in shape and size. The size of the pillar is substantially affected by the wavelength of the photoresist that is being used. Exemplary wavelengths include 248 nm and 193 nm. Advanced micro-masking photolithography techniques, such as phase-shift masks, resist shrinking or growth, and use of spacers, can be used for sub-wavelength lithography.

In a preferred embodiment, this first resist mask 40 forms a series of parallel lines over the surface of the upper hard mask layer 30. After developing, the first resist mask 40 can be used as a mask for an etch process that removes the unmasked portions 42 of the upper hard mask 30.

Figure 3A:
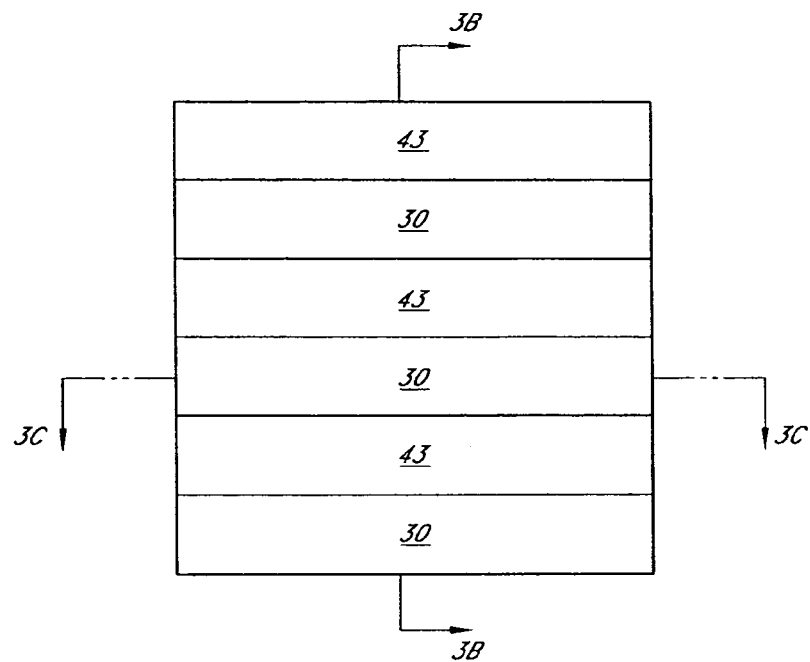
FIGS. 3A-3C show three views of the structure of FIGS. 2A-2C with two mask layers after etching through exposed portions of the two hard mask layers according to an embodiment of the present invention.
Figure 3B:
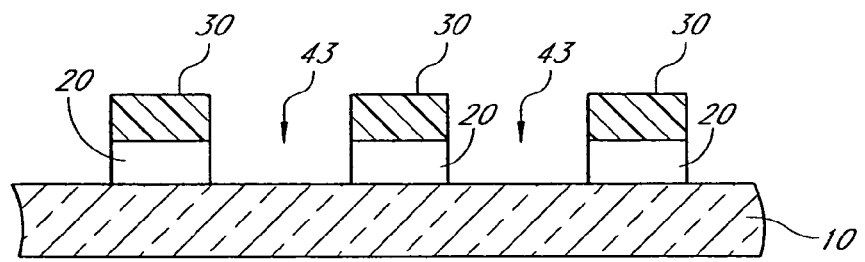
Figure 3C:
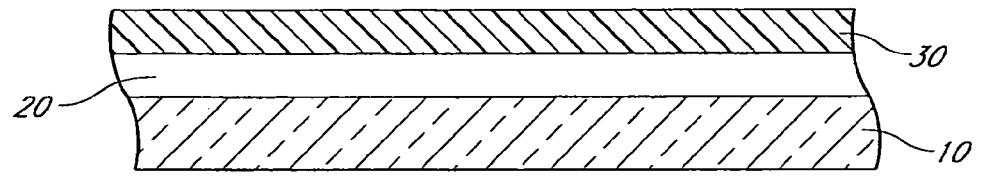

FIGS. 3A-3C show the substrate after the removal of the unmasked portions 42 (FIG. 2B) of the lower hard mask 20 and the upper hard mask 30. The unmasked portions of the lower hard mask 20 can either be removed at the same time as the upper hard mask 30 or in a separate etch step. Preferably, an anisotropic dry etch is used in order to ensure faithful pattern transfer from the photoresist 40 to the upper hard mask 30 and the lower hard mask 20. In a preferred embodiment, a fluorine based plasma is used in the dry etch process when the upper mask layer 30 is silicon nitride and the lower hard mask layer 20 is silicon oxide. Skilled practitioners will appreciate that there are several methods of etching the unmasked portions 42 (FIG. 2B) of the upper hard mask 30 and the lower hard mask 20 selectively to the substrate 10. The removal of the unexposed portions 42 of the upper hard mask 30 and the lower hard mask 20 expose trench regions 43 of the substrate 10 that will eventually be etched to form rows of isolation trenches between transistor columns.

Figure 4A:
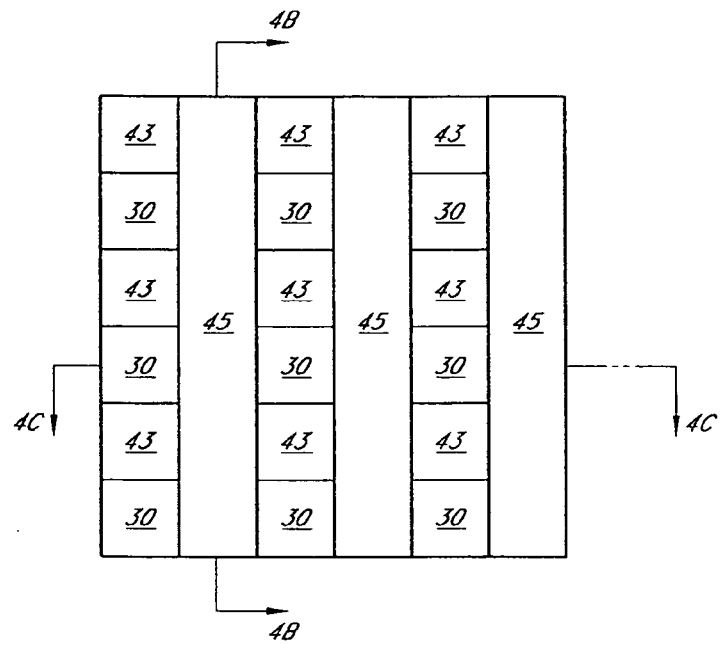
FIGS. 4A-4C show three views of the structure of FIGS. 3A-3C with a second photoresist layer over remaining portions of two hard mask layers according to an embodiment of the present invention.
Figure 4B:
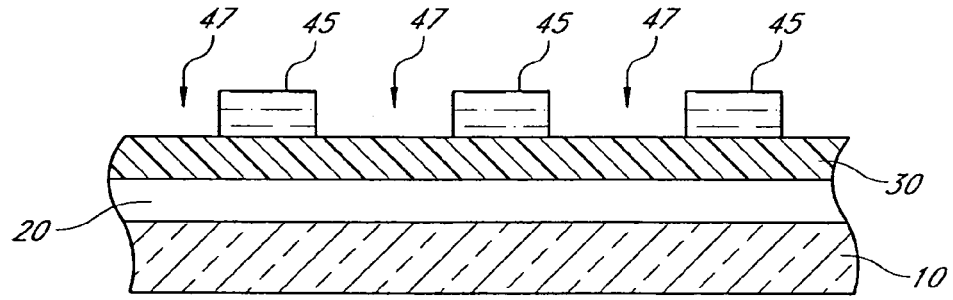
Figure 4C:
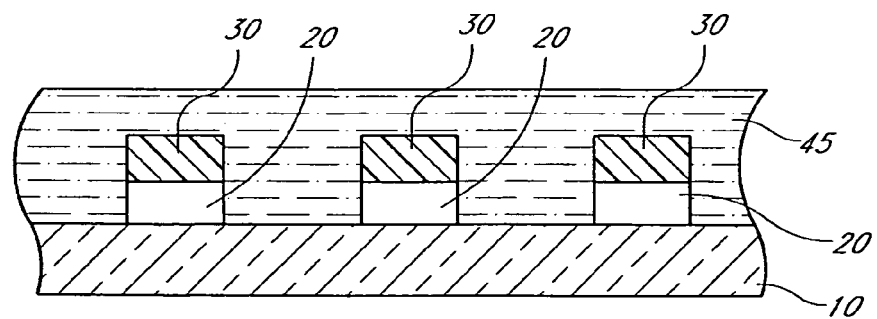

After the first photoresist layer 40 is removed, a second resist mask 45 is formed over the upper hard mask 30. This is illustrated in FIGS. 4A-4C. In a preferred embodiment, the second resist mask 45 forms columns substantially perpendicular to the rows of trench regions 43 and the remaining lower and upper hard mask layers 20 and 30. This allows for the formation of pillars with substantially rectangular footprints over the substrate. Other shapes are also possible using differing shapes of the first and second resist masks 40 (FIG. 2B) and 45. FIG. 4B shows the second resist mask 45 over the upper hard mask 30. FIG. 4C shows a different cross-section of the substrate, where the resist mask 45 is seen over the trench regions 43 and the remaining lower and upper hard masks 20 and 30. The unmasked portions 47 of the upper hard mask 30 and the lower hard mask 20 can eventually form intermediate areas in the substrate 10.

Figure 5A:
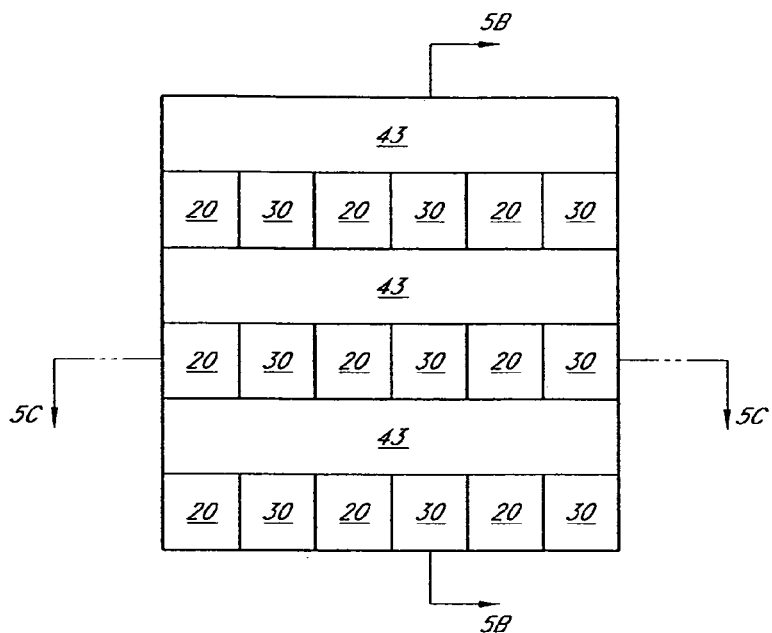
FIGS. 5A-5C show three views the structure of FIGS. 4A-4C after etching through exposed portions of the second hard mask layer, according to an embodiment of the present invention.
Figure 5B:
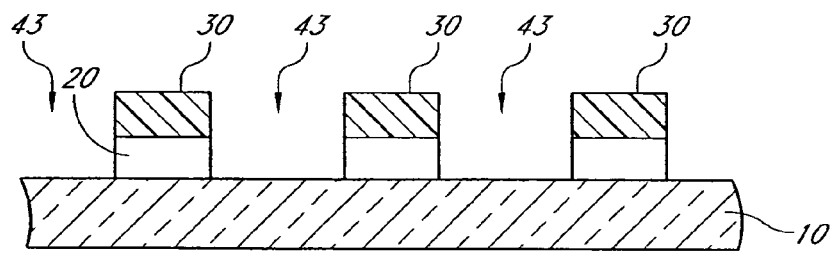
Figure 5C:
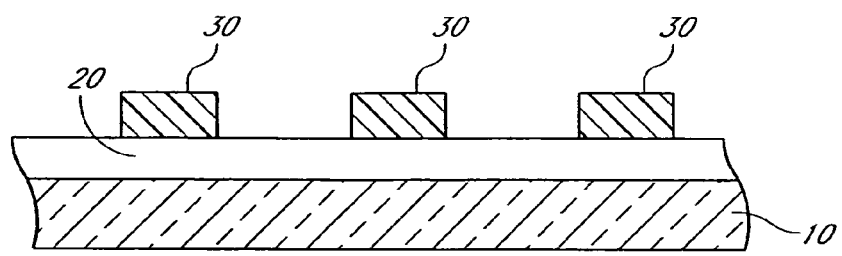

FIGS. 5A-5C show the substrate after removing the unmasked portions 47 (FIG. 4B) of the upper hard mask 30 selective to the lower hard mask 20 and the substrate 10. FIG. 5B shows a first cross-section of the substrate that illustrates the trench regions 43 of the substrate 10. Several stacks of the upper hard mask 30 and the lower hard mask 20 are visible; these stacks are over the substrate regions that will eventually form the silicon pillars. FIG. 5C shows a perpendicular cross-section with the lower hard mask 20 extending in rows over the substrate 30. The upper hard mask 30 can be seen over portions of the lower hard mask 20. The second resist mask 45 is preferably removed after etching the upper hard mask 30.

The pillar, trench, and intermediate regions can be seen in FIG. 5A. The upper hard mask 30 and the lower hard mask layer 20 are over the regions that will form the pillars. In a preferred embodiment, the regions with the lower hard mask 20 exposed form the intermediate regions. These regions, which are preferably at an intermediate height, taller than the trenches but shorter than the pillars, can also be used as bit lines. Preferably, there are no hard mask layers over the trench regions 43. In a preferred embodiment, a chlorine based plasma is used in the dry etch process when the upper mask layer 30 is silicon nitride and the lower hard mask layer 20 is silicon oxide and the substrate 10 is silicon. Skilled practitioners will appreciate that there are several methods to etch preferred materials for the upper hard mask 30 selectively against preferred materials for the lower hard mask 20 and the substrate 10.

First Substrate Etch

Figure 6A:
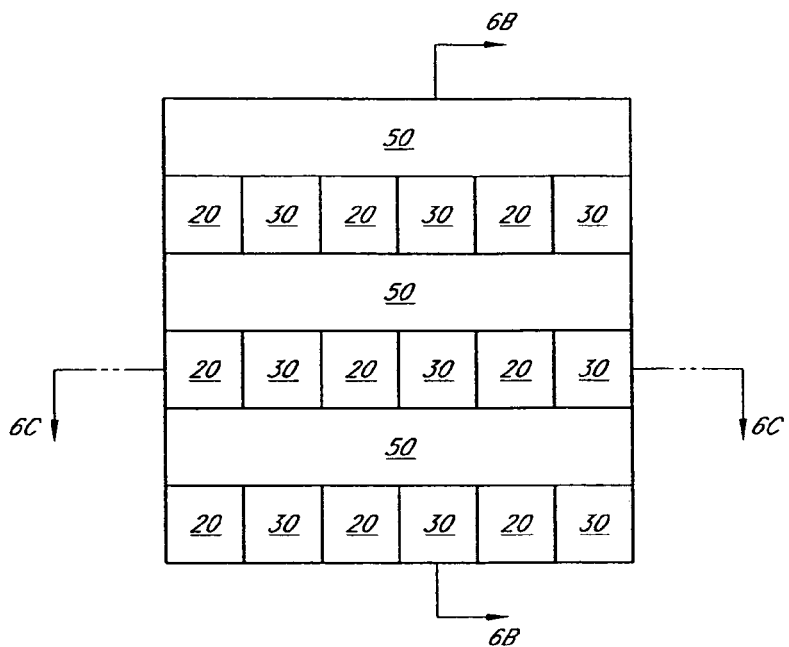
FIGS. 6A-6C show three views of the structure of FIGS. 5A-5C after a first substrate etch step according to an embodiment of the present invention.
Figure 6B:
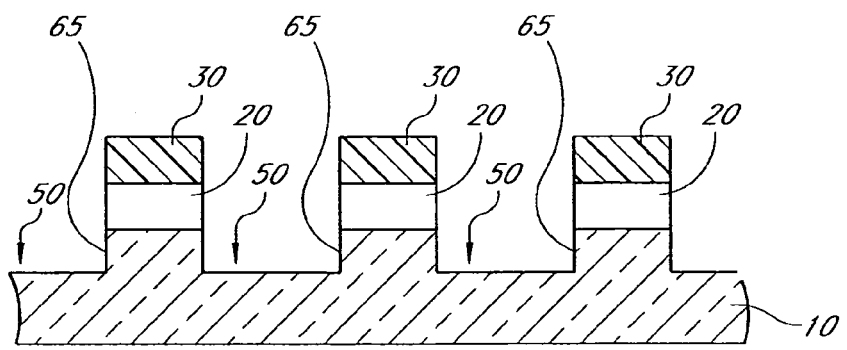
Figure 6C:
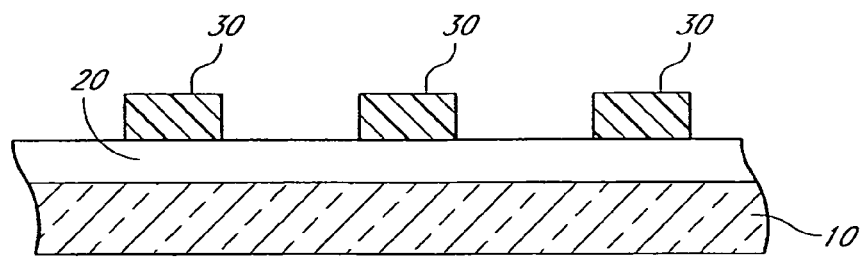

FIGS. 6A-6C illustrate the product of a first substrate etch. In a preferred embodiment, the etch process etches the substrate material 10 but is selective against the upper hard mask 30 and the lower hard mask 20. Preferably, the first substrate etch process removes between about 250 nm and 450 nm, more preferably between about 300 nm and 400 nm. The lower hard mask 20 acts as a hard mask for the first substrate etch, so only the trench regions 43 (FIG. 5A) will be etched to form an intermediate trench 50. FIG. 6B shows the pillar regions 65 with the upper hard mask 30 and the lower hard mask 20 stacks over the substrate 10. FIG. 6C is identical to FIG. 5C because the lower hard mask 20 acts as a mask to the substrate etch, such that substrate 10 is not etched in regions under the lines of the lower hard mask 20. In a preferred embodiment, a chlorine based plasma is used in the dry etch process when the upper mask layer 30 is silicon nitride and the lower hard mask layer 20 is silicon oxide and the substrate 10 is silicon. Skilled practitioners will appreciate that several methods can be used to etch the substrate.

Figure 7A:
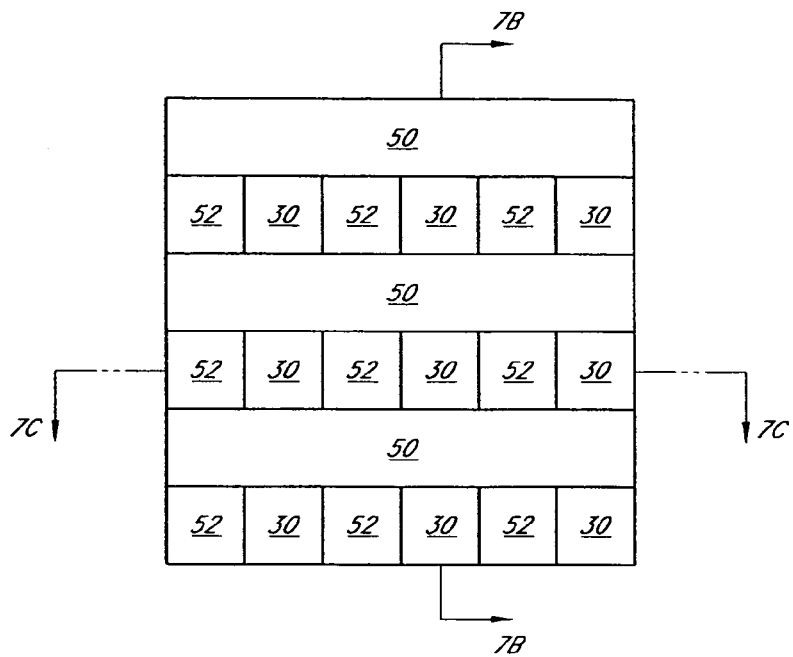
FIGS. 7A-7C show three views of the structure of FIGS. 6A-6C after the first mask layer has been removed according to an embodiment of the present invention, forming partial trenches in field isolation regions.
Figure 7B:
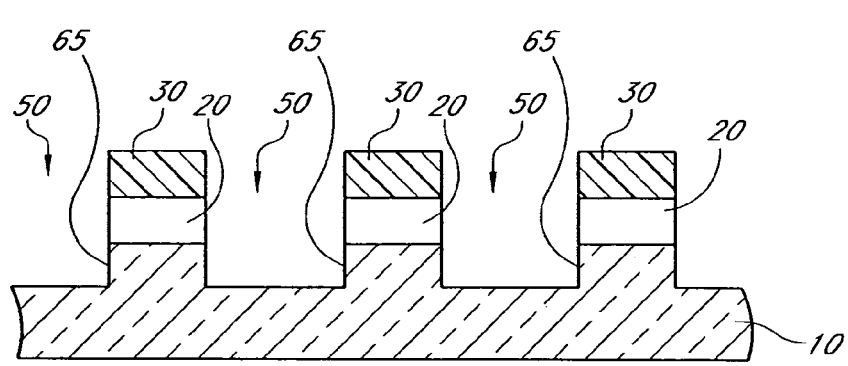
Figure 7C:
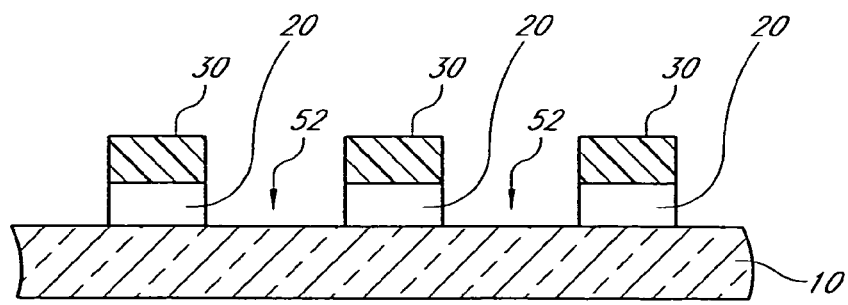

FIGS. 7A-7C illustrate the removal of the portions of the lower hard mask 20 not covered by the upper hard mask 30. This will expose the intermediate regions 52 of the substrate 10. While these regions 52 are preferably used as active areas, the skilled practitioner will appreciate that the active areas could also be formed on the pillars 65. Additionally, the intermediate regions 52 could also be used for other purposes, such as a bit line. At this point, only the pillar regions 65 (FIG. 7B) are covered by the lower hard mask 20 and the upper hard mask 30. At this stage of the process, the lower and upper hard masks 20 and 30 are now unconnected islands. The cross-section of FIG. 7B appears identical to FIG. 6B because at that cross-section there is no exposed lower hard mask 20 to be removed at this stage; the lower hard mask 20 is all masked by the upper hard mask 30. FIG. 7C illustrates a cross-section which shows substrate 10 regions 52 that will become the intermediate regions, which are now exposed, and the regions 65 that will become the pillars, which are capped by the oxide 20 and nitride 30 stack.

Second Substrate Etch

FIGS. 8A-8E illustrate the product of a second substrate etch and the completion of the formation of the silicon pillars. Preferably the second substrate etch process removes between about 200 nm and 400 nm, more preferably between about 250 nm and 350 nm of the substrate 10. After the second substrate etch is complete, the trench regions 55 will be etched to a depth between about 450 nm and 850 nm below the pillar regions 65, more preferably between about 550 nm and 750 nm. The second substrate etch process is selective to the upper hard mask 30 and the lower hard mask 20. Similarly to the first substrate etch step, a chlorine-based plasma etch process can be used in the second substrate etch step. Skilled practitioners will appreciate that several methods can be used to etch the substrate selectively against the nitride mask.

Figure 8A:
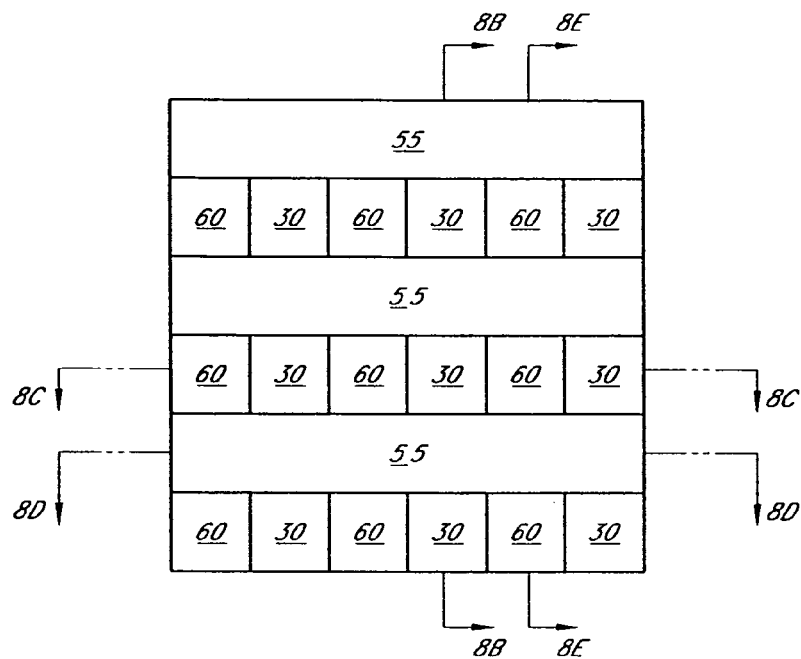
FIGS. 8A-8E show five views of the completed structure after a second substrate etch, resulting in trench regions, active area regions, and pillar regions.

FIG. 8A shows a plan view illustrating the three regions. The trenches 55 have been etched to their final depth, and the intermediate regions 60 have been etched. The trenches 55 have been exposed to both etch steps. The intermediate regions 60 have been exposed to one etch step. The upper hard mask 30 and the lower hard mask 20 remain over the pillars 65. Thus, the pillars 65 have not been exposed to either etch step.

Figure 8B:
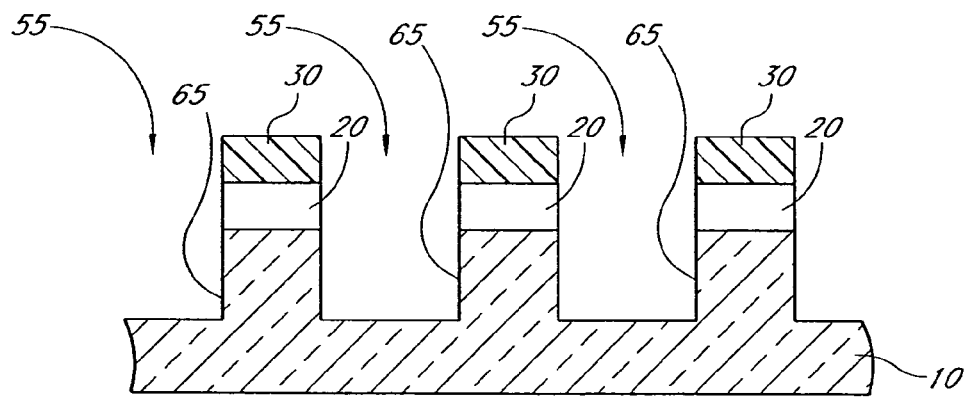
Figure 8C:
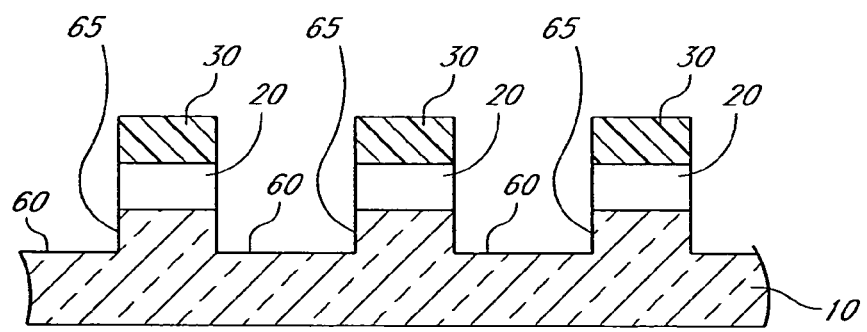
Figure 8D:
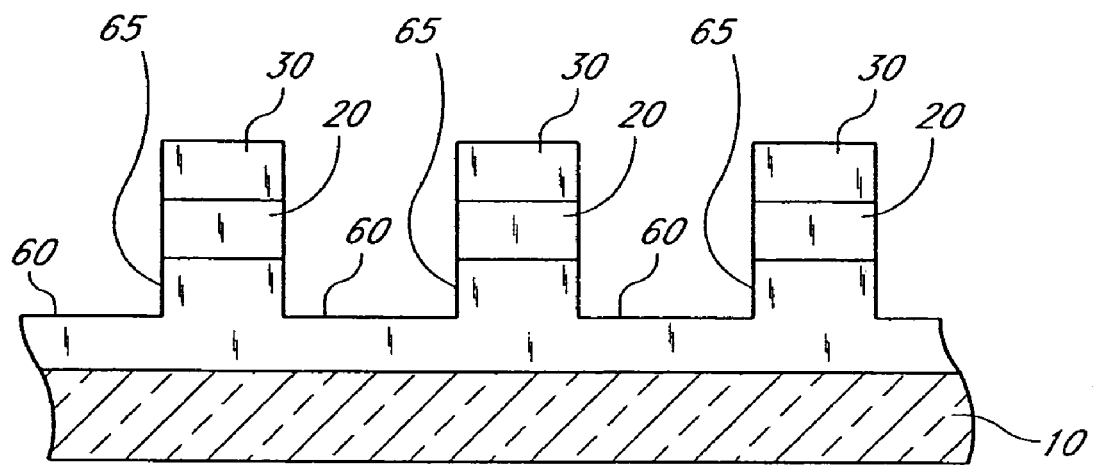
Figure 8E:
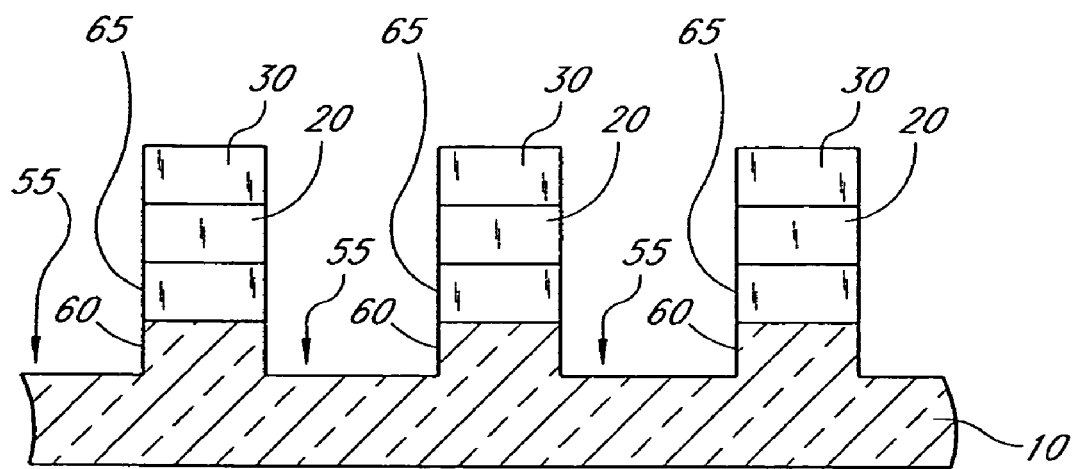

The upper hard mask 30 and the lower hard mask 20 can be seen over the pillars 65 in FIG. 8B, a cross-sectional view. In FIG. 8C, the pillars 65 and the two hard masks 20 and 30 can be seen next to the intermediate regions 60, which are formed in rows within shallow trenches between pillars 65. The rows are elevated relative to the deeper trenches 55, as best seen from FIG. 8D. In FIG. 8D, a trench 55 can be seen in cross-section. The pillars 65, intermediate regions 60, and two hard masks 20 and 30 can be seen in relief behind the trench 55. In FIG. 8E, the intermediate regions 60 can be seen beside the trenches 55. The pillars 65 and the hard masks 20 and 30 can be seen in relief behind the intermediate regions 60.

Structure

As seen in FIG. 8A, there will be three (3) levels of silicon substrate after the second substrate etch. The deepest level will be the trench region 55, as it will have been exposed to two substrate etch steps. The intermediate regions 60 will have been masked by the lower hard mask 20 during the first substrate etch step. The silicon pillars 65 will have not been exposed to either etch step and will still be capped by the oxide 20 and nitride 30 stack.

In a preferred embodiment, the second substrate etch step etches the substrate to an approximately equal depth as the depth of the first substrate etch. In FIG. 8B, the silicon pillars 65 are shown in cross-section next to the trenches 55. The silicon pillars are still capped by the oxide 20 and nitride 30 stack, and therefore have not been exposed to either substrate etch. In another cross-section shown in FIG. 8C, the silicon pillars 65 are next to the intermediate regions 60, which have been exposed to one substrate etch step. FIG. 8D is a cross section from within a trench region 55. The other regions appear in surface shading behind the trench substrate region 55. A layer of substrate material which forms the intermediate regions 60 and the silicon pillars 65 is seen over the trench region. The pillar region 65 is capped by the oxide 20 and nitride 30 stack. In the illustrated embodiment, measured from the floor of the trench region 55, the pillar region 65 is approximately twice as tall as the intermediate regions 60. This can also be seen from FIG. 8E which shows a cross-section through the intermediate regions 60 and the trench regions 55. The silicon pillars 65, which can be seen behind the intermediate regions 60, are approximately twice as tall as the intermediate regions 60.

Figure 9:
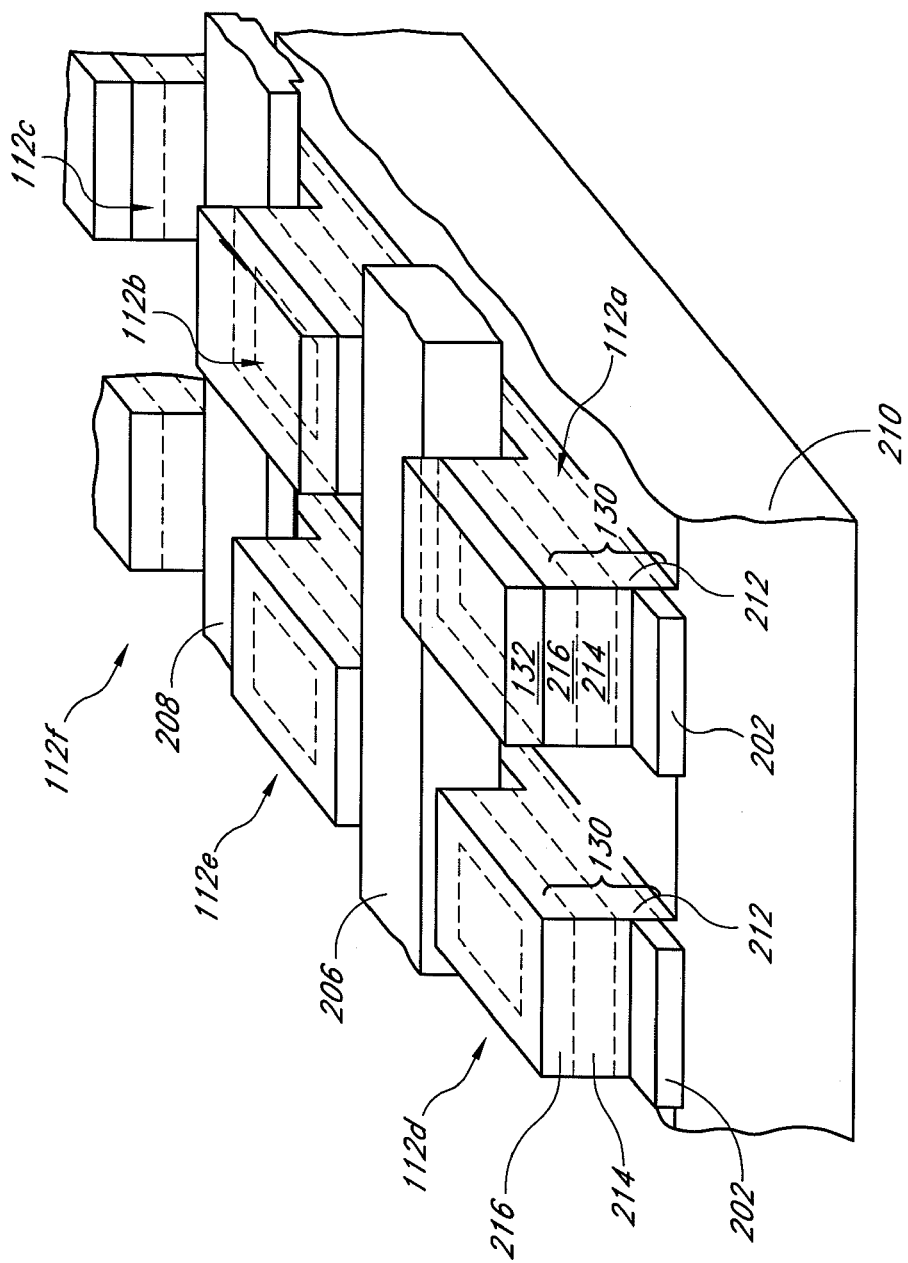
FIG. 9 is a partial isometric view of an array formed using silicon pillars such as those illustrated in FIGS. 8A-8E.

In a preferred embodiment, the intermediate, or "active area" regions 60, are used to form the active area for a transistor. However, the "active area" regions 60 may also be used for other purposes, such as forming a bit line, as seen in FIG. 9. A skilled artisan can appreciate that the structure formed by the process illustrated in FIGS. 1-8 can be used to form several types of structures through subsequent processing.

In FIG. 9, an exemplary memory array using silicon pillars, such as those created by the process described above, is illustrated. Transistors formed using silicon pillars are described in U.S. Pat. No. 6,492,233 which was issued to Forbes, et al, on Dec. 10, 2002. The disclosure of the Forbes patent is incorporated by reference herein. FIG. 9 is a perspective view illustrating generally one embodiment of a portion of a memory according to the present invention. FIG. 9 illustrates portions of six memory cells 112a-f including portions of vertically oriented access FETs 130 therein. Conductive segments of bit lines 202 represent particular ones of bit lines in the array. Conductive segments of word line 206 represent any one of the word lines in the array, which provide integrally formed gate regions for access FETs 130 between which the particular word line 206 is interposed. Conductive segments of body line 208 represents any one of body lines in the array, which provide interconnected electrical body contacts to body regions of access FETs 130 between which the particular body line 208 is interposed. Thus, the word lines, e.g. word line 206, and the body lines, e.g. body line 208, are alternatingly disposed (interdigitated) within the array 110. The detailed description below of the memory cell 112 refers only to memory cells 112a-f, the bit lines 202, the word line 206 and the body line 208 that are associated with memory cells 112a-f. However, the following description similarly applies to all memory cells 112 and similar conductive lines in a larger array.

In FIG. 9, vertically oriented access FETs 130 are formed in semiconductor pillars that extend outwardly from an underlying substrate 210. As described below, the substrate 210 can be bulk semiconductor starting material, semiconductor-on-insulator (SOI) starting material, or SOI material that is formed from a bulk semiconductor starting material during processing.

In one example embodiment, using bulk silicon processing techniques, access FETs 130 includes first source/drain regions 212 of the access FETs 130 formed on the bulk silicon substrate 210 and integrally formed n++ conductively doped bit lines 202. The bit lines 202 define a particular row of memory cells 112. A body region 214 of access FET 130 is formed on the n+ first source/drain region 212. Inversion channels may be capacitively generated at the sidewalls of the body region 214 of the semiconductor pillar under the control of word line 206. The word line 206 includes the gate region of adjacent access FETs 130. A second source/drain region 216 of access FET 130 is formed on p-body region 214. Storage capacitors 132 are formed on the second/source drain regions 216. In a preferred embodiment of the formation of these transistors, the substrate is grown epitaxially before the processing steps of FIGS. 1-8. However, transistors can also be formed from silicon pillars formed from a bulk silicon substrate. Additionally, while doping steps are not specifically described, a skilled artisan will understand the doping processes of these silicon materials.

Word lines 206 and body lines 208 are alternatingly disposed (interdigitated) within the array. For example, one of the word lines 206 is interposed between each semiconductor pillar of memory cell pairs 112a-b and 112d-e. Body line 208 is interposed between semiconductor pillars of memory cell pairs 112b-c and 112e-f. Thus, as seen from FIG. 9, access FETs 130 are formed on bit lines 202 in semiconductor pillars extending outwardly from substrate 210. Such semiconductor pillars include body regions 214, and first and second source drain regions 212 and 216, respectively. In this embodiment, the bit lines 202 contact the bulk semiconductor substrate 210, and the body lines 208 contact body regions 214 of adjacent access FETs 130.

Figure 10:
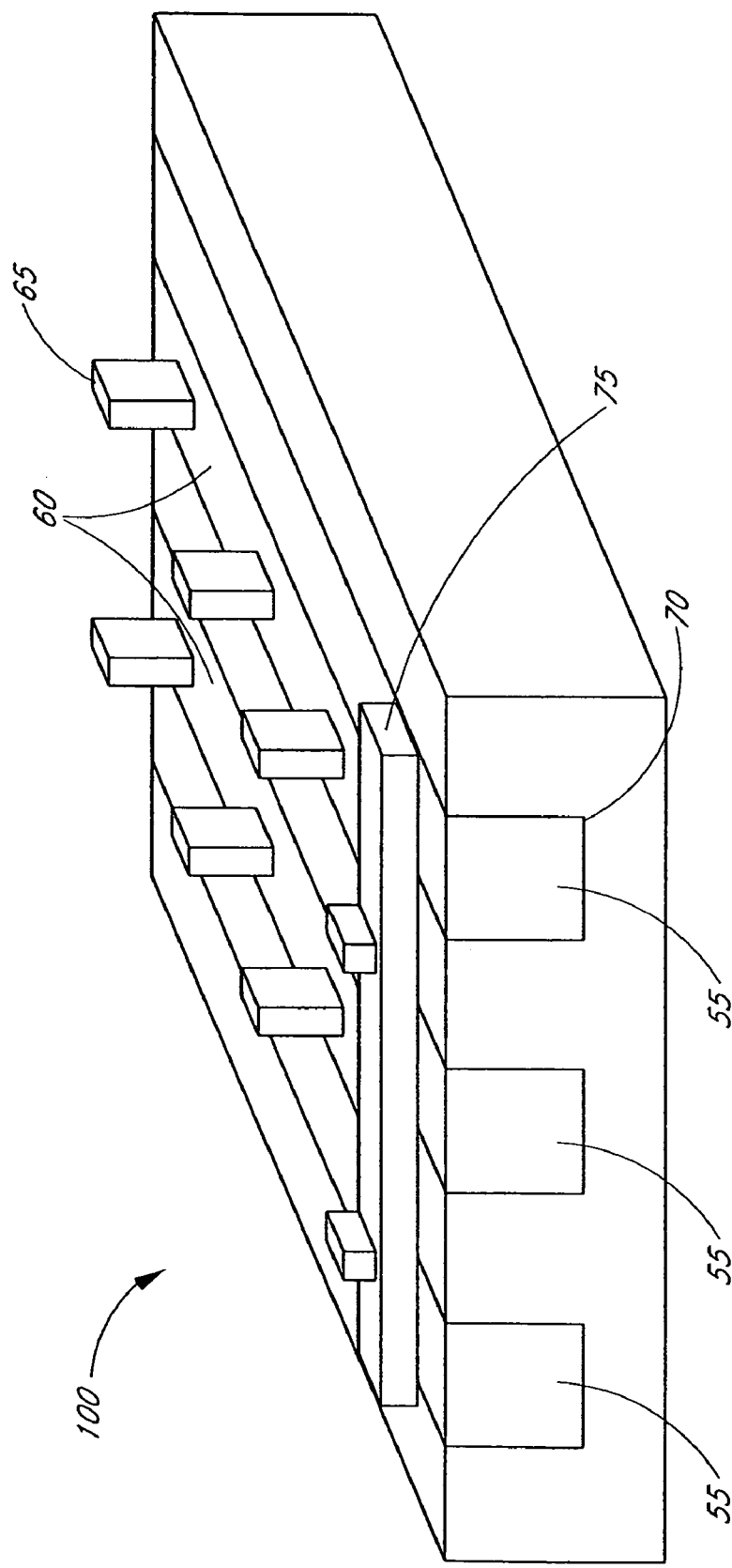
FIG. 10 is a partial isometric view of the structure of FIG. 8A-8E after filling trench regions and forming a word line connecting neighboring cells.

The memory of FIG. 9 is merely an exemplary embodiment of transistors formed using silicon pillars. The silicon pillars can be used to form several different types of vertical transistors. In a preferred embodiment seen in FIG. 10, the trenches 55 are filled with an insulating material 70, preferably an oxide. The insulating material 70 is recessed to a height approximately equal to the height of the active areas 60. The pillar 65 is preferably oxidized to form a gate dielectric for the vertical transistor. Word lines 75 are preferably formed perpendicularly to the insulating material 70. The word lines surround the pillars 65 and connect a row of vertical transistors formed in the array 100. Although only one word line 75 is shown in FIG. 10, preferably there will be a plurality of parallel word lines in the array 100. The skilled artisan will appreciate that silicon pillars have a wide variety of uses in semiconductor fabrication, especially with respect to transistor formation.

Skilled artisans will appreciate that the principles and advantages have application for etching materials at other stages of integrated circuit fabrication. Materials selected for the substrate 10, the lower hard mask 20, and the upper hard mask 30 can be varied for other uses. Particularly, the principles described herein will improve the etching process when a structure needs to be etched to varying depths in different regions. The pillars 65 can be useful in other contexts such as memory cell capacitors, in trenches for hybrid shallow trench isolation (STI) and LOCal Oxidation of Silicon (LOCOS) isolation schemes, and for many other purposes.

CONCLUSION

Although the foregoing invention has been described in terms of a preferred embodiment, other embodiments will become apparent to those of ordinary skill in the art, in view of the disclosure herein. Accordingly, the present invention is not intended to be limited by the recitation of preferred embodiments, but is instead intended to be defined solely by reference to the appended claims.

I claim:

1. A method of forming an integrated circuit, comprising:
defining an array region on a semiconductor substrate;
etching a first set of parallel lines to a first depth in the defined array region;
etching a second set of parallel lines to a second depth and the first set of parallel lines to a third depth in the defined array region, the second set of parallel lines crossing the first set of parallel lines, wherein portions of the substrate that are not etched by etching the first and second sets of parallel lines form protruding semiconductor structures of an array of transistors.

2. The method of claim 1, wherein the third depth is equal to a sum of the first depth and the second depth.

3. The method of claim 1, wherein the third depth is greater than the first depth and the second depth.

4. The method of claim 1, further comprising forming bit lines in the etched second set of parallel lines.

5. The method of claim 4, further comprising forming a first source/drain region for each protruding semiconductor structure and a second source/drain region for each protruding semiconductor structure to form vertical transistors.

6. The method of claim 5, further comprising forming alternating body lines and wordlines in the first set of parallel lines after etching to the third depth.

7. The method of claim 6, wherein the second source/drain region is formed at the top of each protruding semiconductor structure, further comprising forming capacitors electrically connected to the second source/drain region.

8. The method of claim 7, wherein the vertical transistors are Field Effect Transistors (FETs).

9. A method of forming a memory array, comprising:
exposing a first set of parallel lines on a substrate;
etching the first set of parallel lines to a first depth;
exposing a second set of parallel lines on the substrate after etching the first set of parallel lines, wherein the second set of parallel lines crosses the first set of parallel lines; and
etching the exposed second set of parallel lines to a second depth and simultaneously etching first etched set of parallel lines to a third depth, wherein the third depth is greater than the first depth and the second depth, and wherein a silicon structure protruding among the first and second sets of parallel lines is formed in the substrate.

10. The method of claim 9, wherein the silicon structure is a silicon pillar protruding from the substrate.

11. The method of claim 9, wherein the second set of parallel lines is substantially perpendicular to the first set of parallel lines.

12. The method of claim 9, further comprising forming active areas for transistors in the etched second set of parallel lines.

13. The method of claim 12, further comprising filling the first set of parallel lines after etching to the third depth with an insulating material to the height of the active areas.

14. The method of claim 13, further comprising forming a gate dielectric on the silicon structure to form a vertical transistor.

15. The method of claim 14, further comprising forming wordlines within the second set of parallel lines, one of the wordlines surrounding the silicon structure and electrically connecting a row of vertical transistors in a memory array.

16. A method of forming silicon pillars, comprising:
exposing a first series of parallel lines on a substrate to one substrate etch step; and
exposing a second series of parallel lines on the substrate to two substrate etch steps, wherein the second series of parallel lines crosses the first series of parallel lines, and wherein regions of the substrate not exposed to the substrate etch steps form an array of silicon pillars.

17. The method of claim 16, wherein the etched first series of parallel lines are etched to a first depth and the etched second series of parallel lines are etched to a second depth.

18. The method of claim 17, wherein the second depth is greater than the first depth.

19. The method of claim 17, wherein the first depth is between approximately 200 nm to approximately 400 nm, and wherein the second depth is between approximately 450 nm to approximately 850 nm.

20. The method of claim 17, wherein the first depth is between approximately 250 nm to approximately 350 nm, and wherein the second depth is between approximately 550 nm to approximately 750 nm.

21. The method of claim 17, wherein the second depth is approximately twice as deep as the first depth.

22. The method of claim 16, wherein the second series of parallel lines is substantially perpendicular to the first series of parallel lines.

* * * * *